United States Patent [19]

Yamada

[11] Patent Number: 5,105,089
[45] Date of Patent: Apr. 14, 1992

[54] ELECTRON BEAM EXPOSURE SYSTEM

[75] Inventor: Akio Yamada, Kawasaki, Japan

[73] Assignee: Fujitsu Limited, Kawasaki, Japan

[21] Appl. No.: 718,378

[22] Filed: Jun. 20, 1991

[30] Foreign Application Priority Data

Jun. 20, 1990 [JP] Japan .................................. 2-162219

[51] Int. Cl.$^5$ ........................................... H01J 37/04
[52] U.S. Cl. .................................. 250/492.2; 250/398
[58] Field of Search .................... 250/492.2 R, 492.22, 250/492.23, 396, 398, 400; 219/121.25, 121.26

[56] References Cited

U.S. PATENT DOCUMENTS

| | | | |
|---|---|---|---|
| 4,140,913 | 2/1979 | Anger et al. | 250/398 |
| 4,145,597 | 3/1979 | Yasuda | 250/396 R |
| 4,169,230 | 9/1979 | Bohlen | 250/400 |
| 4,213,053 | 7/1980 | Pfeiffer | 250/398 |
| 4,914,304 | 4/1990 | Koyama | 250/492.2 |
| 5,036,209 | 7/1991 | Kataoka et al. | 250/492.2 |

FOREIGN PATENT DOCUMENTS

| | | | |
|---|---|---|---|
| 0113220 | 7/1987 | Japan | 250/492.22 |
| 0321647 | 12/1989 | Japan | 250/492.2 |

Primary Examiner—Jack I. Berman
Assistant Examiner—James E. Beyer
Attorney, Agent, or Firm—Staas & Halsey

[57] ABSTRACT

An electron exposure system comprises an electron source for emitting an electron beam in a path along a predetermined optical axis, a mask carrying a plurality of apertures corresponding to a pattern that is to be written on an object, a first deflector unit provided at a side of the mask closer to the electron source for shifting the electron beam from the optical axis by causing a deflection of the beam such that the electron beam passes through one of the apertures in the mask means in a direction substantially perpendicular to the mask, a second deflector unit provided at a side of the mask away from the electron source for shifting the electron beam such that the electron beam travels again in a path coincident with the optical axis, a focusing system for focusing the electron beam on the object, and a third deflector unit for deflecting the focused electron beam onto the object, wherein the mask further includes a calibration part having a size corresponding to an area within which the electron beam is shifted by the first deflection means. The calibration part includes a plurality of apertures of a predetermined size and disposed relatively to each other at a common, predetermined interval for calibrating the deflection of the electron beam caused by the first and second deflector units.

7 Claims, 3 Drawing Sheets

ELECTRON BEAM EXPOSURE SYSTEM

BACKGROUND OF THE INVENTION

The present invention generally relates to electron beam exposure systems and more particularly to an electron beam exposure system for writing a pattern on an object by an electron beam.

With the requirement of increased integration density and reduced device size, use of the electron beam exposure systems is spreading in the fabrication of semiconductor integrated circuits. In the electron beam exposure system, an electron beam of rectangular or other suitable cross sections is used for writing a pattern on a semiconductor wafer while changing the size of the beam spot. Such an electron beam exposure system is particularly advantageous for patterning minute semiconductor devices, as the electron beam exposure system is capable of writing submicron patterns on the object. On the other hand, the electron beam exposure system has suffered from a problem of low throughput because of the feature pertinent to such a system that the pattern has to be written consecutively step by step by a single electron beam.

In order to avoid the foregoing problem of low throughput, a technique called block exposure has been proposed (IEEE TRANS. ON ELECTRON DEVICES, vol.ED-26, p.633, 1979), wherein a patterned mask is placed in the path of the electron beam between the electron gun and the object. The mask carries a number of patterned apertures that correspond to various basic patterns of semiconductor devices, and deflector systems are disposed at both sides of the mask. Thereby, the deflector at the upstream side of electron beam causes a deflection of electron beam away from an optical axis and directs the same to one of the patterned apertures. On the other hand, the deflector at the downstream side causes a deflection of the electron beam back to the original optical axis. Upon passage through the selected aperture, the electron beam is shaped as desired and hits the surface of the object, such as a semiconductor wafer, at a predetermined position after focusing and deflection caused by the usual electron lens and deflection systems.

FIG. 1 shows such an electron exposure system that carries out the block exposure.

Referring to FIG. 1, the electron exposure system includes an electron gun 14 that produces an electron beam 16. The electron beam 16 travels along a predetermined optical axis and experiences shaping upon passage through an aperture 18. After passing through the aperture 18, the electron beam is focused by an electron lens 20 at a point P1 located on the optical axis.

At the point P1, there is provided an electrostatic deflector 22 that causes a deflection of the electron beam 16 away from the optical axis in response to a control signal applied thereto. At the downstream side of the deflector 22, there is provided a mask 10 in which a number of patterned apertures 12-1 - 12-5 are formed, and the deflector 22 causes the deflection of the electron beam 16 to one of the apertures on the mask 10. Upon passage through the selected aperture, the electron beam 16 experiences shaping for the second time and thus, the electron beam exiting from the mask 10 has a desired cross section.

In correspondence to the mask 10, there is provided an electron lens 28 such that the optical axis of the lens 28 coincides with the optical axis of the electron beam, and the lens 28 focuses the electron beam passing therethrough. More specifically, the electron beam 16 that has exited from the mask 10 is deflected and focused on a point P2 located on the original optical axis of the beam 16. Further, the electron beam is demagnified by a lens 30 and deflected by the deflectors 34 and 36 provided immediately above a semiconductor wafer 38. Thereby, the electron beam 16 hits the predetermined part of the surface of the wafer 38 with a desired cross section.

In the foregoing conventional apparatus, however, there exists a problem in that, associated with the focusing action of the electron lens 28 that deflects back the electron beam to the point P2 on the optical axis, the electron beam tends to experience deformation by various aberration effects that are caused by the electron lens. It should be noted that the path length of the electron beam changes depending on what aperture on the mask 10 is selected. The effect of aberration appears strongly particularly when the aperture which is far from the optical axis is selected since as the electron beam is deflected by a large angle and then deflected back by also a large angle in such a case.

In order to eliminate the foregoing problems, the applicant of the present invention has previously proposed an electron beam exposure system wherein an incidence side electron lens and an exit side electron lens are disposed respectively at the upstream side and the downstream side of the mask, and the electron beam passes through the aperture in the mask with an angle perpendicular to the plane of the mask. Between the incidence side electron lens and the mask, there is provided an incidence side deflector system for shifting the path of the electron beam parallel to the optical axis. Further, between the mask and the exit side electron lens, there is provided an exit side deflector system for shifting back the electron beam back to the original optical path.

FIG. 2 shows the electron beam exposure system described above.

Referring to FIG. 2, there is provided an electron gun 68 that produces an electron beam 70. The electron beam 70 travels along a predetermined optical axis 90 and passes through a beam shaping aperture 72. Thereby, the electron beam 70 experiences beam shaping and passes through an electron lens 74 subsequently. The electron lens 74 focuses the electron beam 70 on a point P1 located on the optical axis 90 and a minute adjustment of the electron beam is achieved by a deflector 76.

The electron beam is then passed through another electron lens 78 where it is converted to a parallel electron beam, and the parallel electron beam thus formed hits a mask 40 substantially perpendicularly. The mask 40 is formed with a number of patterned apertures in correspondence to the mask 10 of the system of FIG. 1, and the electron beam is shaped as desired upon passage through a selected aperture. The electron beam, thus passed through and shaped by the mask 40, is then received by another electron lens 92 located at the downstream side of the electron beam 40 and focused on a point P2 located on the optical axis 90. The mask 40 carries a large number of patterned apertures that which differ from each other and which are arranged in aperture groups, and these aperture groups are selectively placed into the area through which by the electron beam passes by a mask drive unit 104 which moves the mask 40 in a direction perpendicular to the optical path 90.

In order to effect the desired shifting of the electron beam, the system of FIG. 2 employs a pair of deflectors 80 and 82 provided between the lens 78 and the mask 40 wherein the deflector 80 deflects the electron beam away from the optical axis 90 and the deflector 82 deflects the electron beam thus deflected back to a path parallel to the original optical path 90. Further, there are provided deflectors 84 and 86 between the mask 40 and the lens 92 such that the electron beam, after passing through the mask 40, is deflected toward the optical axis 90 by the deflector 84 and the electron beam thus deflected by the deflector 84 is further deflected by the deflector 86 such that the electron beam returns to the original optical path 90. The foregoing lens 92 focuses the electron beam, after experiencing the deflection of the deflector 86, on the point P2. Further, there is provided a control unit 88 which supplies control signals to the deflectors 80, 82, 84 and 86, and in response to the control signals, the foregoing deflection of the electron beam occurs.

The electron beam thus obtained at the point P2 is shaped according to the pattern of the selected aperture on the mask 40 and is focused on the surface of a wafer 102 after passing through the usual electron optical system that includes lenses 94 and 98 as well as deflectors 100. Between the lens 94 and lens 98, there is provided an aperture or pinhole 96 for proper alignment of the electron optical system. More specifically, the pinhole 96 has a limited diameter of about 100 μm and allows the passage of an electron beam there through only when the electron beam has traveled along the optical axis 90 through the electron lenses 94 and 98. The role of the pinhole 96 will be described later in relation to the present invention.

In this electron exposure system, it should be noted that the electron beam passes through the aperture on the mask 40 in the direction substantially perpendicular to the plane of the mask. Further, the electron beam passes only through the central part of the lenses 78 and 92. Thus, one can eliminate the problem of aberration caused by the electron lens by using this electron exposure system.

In such an electron exposure system known commonly as the block exposure system, it is necessary to calibrate the deflectors 80 and 82 at the upstream side of the mask 40 as well as the deflectors 84 and 86 at the downstream side. Such a calibration includes two types of calibrations, i.e., a) calibration about the mutual relationship of the deflection angles caused by the deflectors 80–86; and b) calibration about the absolute magnitude of deflection caused by the deflectors 80–86. Here, the calibration a) establishes a mutual relationship between the control signals applied to the deflectors 80–86 such that the electron beam deflected away from the optical axis 90 by the deflector 80 returns to the optical axis 90 again after deflection by the deflector 86. The calibration b) on the other hand determines the absolute magnitude of the control signals that are supplied to the deflectors 80–86 for the desired deflection. Such a calibration process is generally time consuming and decreases the productive throughput of the electron exposure.

SUMMARY OF THE INVENTION

Accordingly it is a general object of the present invention to provide a novel and useful electron beam exposure system wherein the foregoing problems are eliminated.

Another and more specific object of the present invention is to provide an electron beam exposure system that uses a plurality of deflectors at both sides of a mask for shaping the electron beam, said plurality of deflectors deflecting the electron beam to address i.e. pass through, a selected aperture on the mask for beam shaping, wherein the calibration of the deflectors is achieved easily.

Another object of the present invention is to provide an electron beam exposure system having a mask for shaping the electron beam, said mask carrying a plurality of patterned apertures for shaping the beam, said electron beam exposure system including a plurality of deflectors provided for addressing the apertures on the mask, wherein there is provided a first patterned aperture that is used for establishing a mutual relationship between the deflection caused by the plurality of deflectors, and wherein there is provided a second patterned aperture that is used for calibrating the absolute magnitude of the deflection caused in the electron beam. According to the present invention, the deflection of the electron beam is controlled such that the path of the electron beam is shifted parallel to the original path by the deflectors by an exact, desired distance and passes through the selected aperture. After passing through the selected aperture, the electron beam returns exactly to the original path, and thus coinciding with the optical axis of the electron beam exposure system. With the use of the first and second patterned apertures, the calibration of the deflectors is established efficiently.

Other objects and further features of the present invention will become apparent from the following detailed description when read in conjunction with the attached drawings.

DETAILED DESCRIPTION

Figure 1:
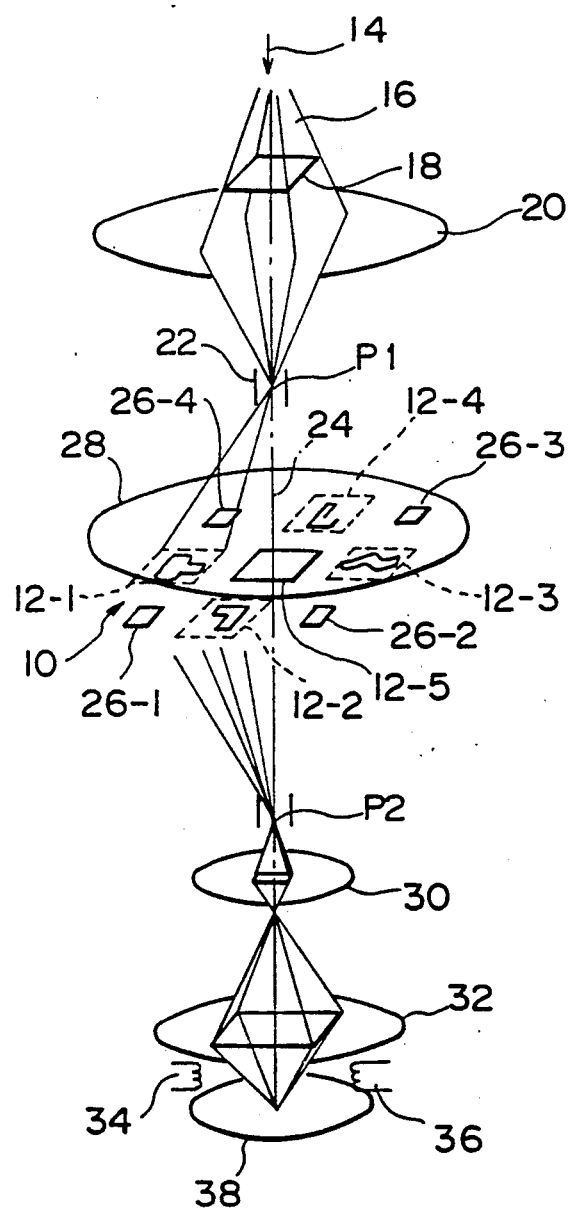
FIG. 1 is a diagram showing a conventional electron beam exposure system.

Hereinafter, a first embodiment of the present invention will be described with reference to FIG. 3, which shows a the mask used in combination with the system of FIG. 2 and FIG. 4, which shows a cross section of the FIG. 23 view of mask 40. In the description below, those parts which are described previously with reference to FIG. 2 are designated by the same reference numerals and the description thereof will be omitted.

Figure 3:
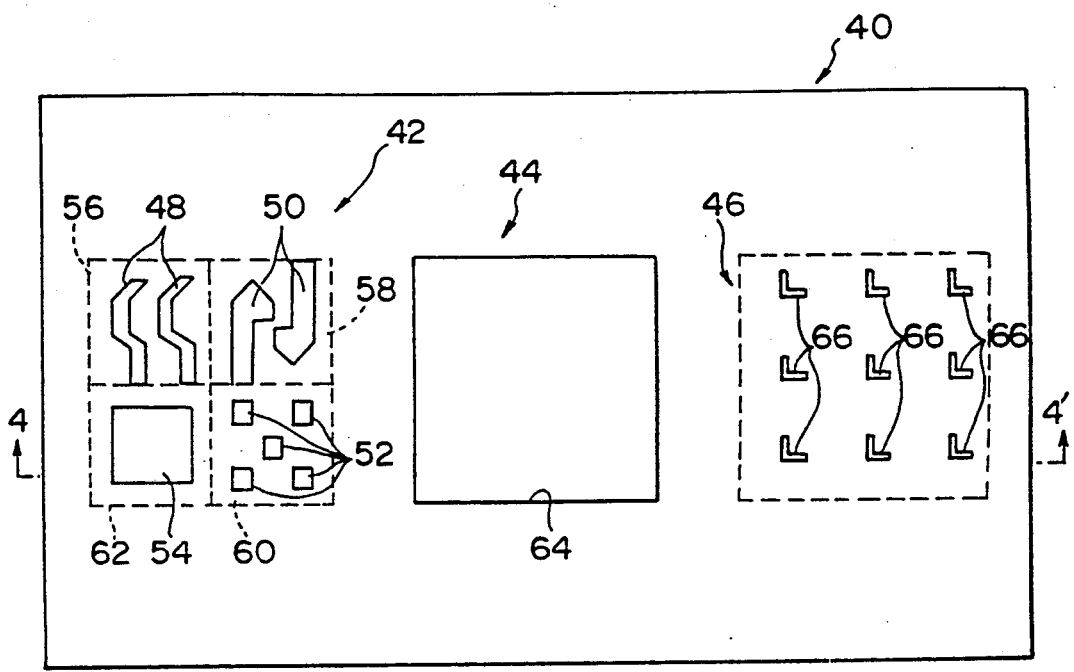
FIG. 3 is a plan view of a mask for use in the system of FIG. 2 and in accordance with a first embodiment of the present invention.
Figure 4:
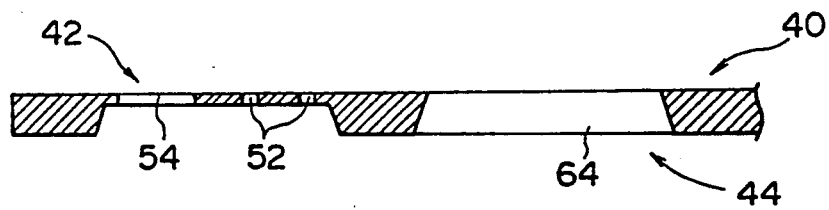
FIG. 4 is a cross sectional view of the mask of FIG. 3.

Referring to FIG. 3, the mask 40 carries a number of patterned apertures that are classified into several types. For example, there is a pattern group 42 that is divided into areas 56, 58, 60 and 62 each including patterned apertures such as 48, 50, 52 and 54 in correspondence to a pattern which is to be written on the wafer 102 by a single shot. Typically, each of the areas 56, 58, 60, 62, . . . has an edge dimension of about 500 μm. There are a number of different pattern groups 42 on the mask 40, each including a respective different set of apertures.

In addition to the pattern group 42, there is provided a first calibration part 44 which includes a cutout 64 formed in the mask 40. The cutout 64 may for example have a size of 5 mm for each edge in correspondence to the maximum amplitude of beam deflection. By providing the cutout region 64 with such a size, one can deflect the electron beam freely without being interrupted when the mask 40 is set such that the electron beam passes generally at the center of the pattern 44. As shown in the elevational cross section of FIG. 4 taken along the line 4-4' of FIG. 3, the cutout 64 penetrates through the mask 40 and passes the electron beam there through freely.

Further, there is provided a second calibration part 46 wherein a number of patterned apertures 66 are formed in a row and column formation. Here, each patterned aperture 66 is separated from adjacent apertures in the same part 46 by an equal distance that may be 500 μm, for example. When the electron beam hits the aperture 66, the mask 40 allows the electron beam to pass there through freely, while when the electron beam misses the appropriate aperture 66, in calibration part 46 the beam is interrupted.

Next, the operation of calibration in the electron beam exposure system of FIG. 2, achieved by using the mask 40 of FIG. 3, will be described.

Figure 2:
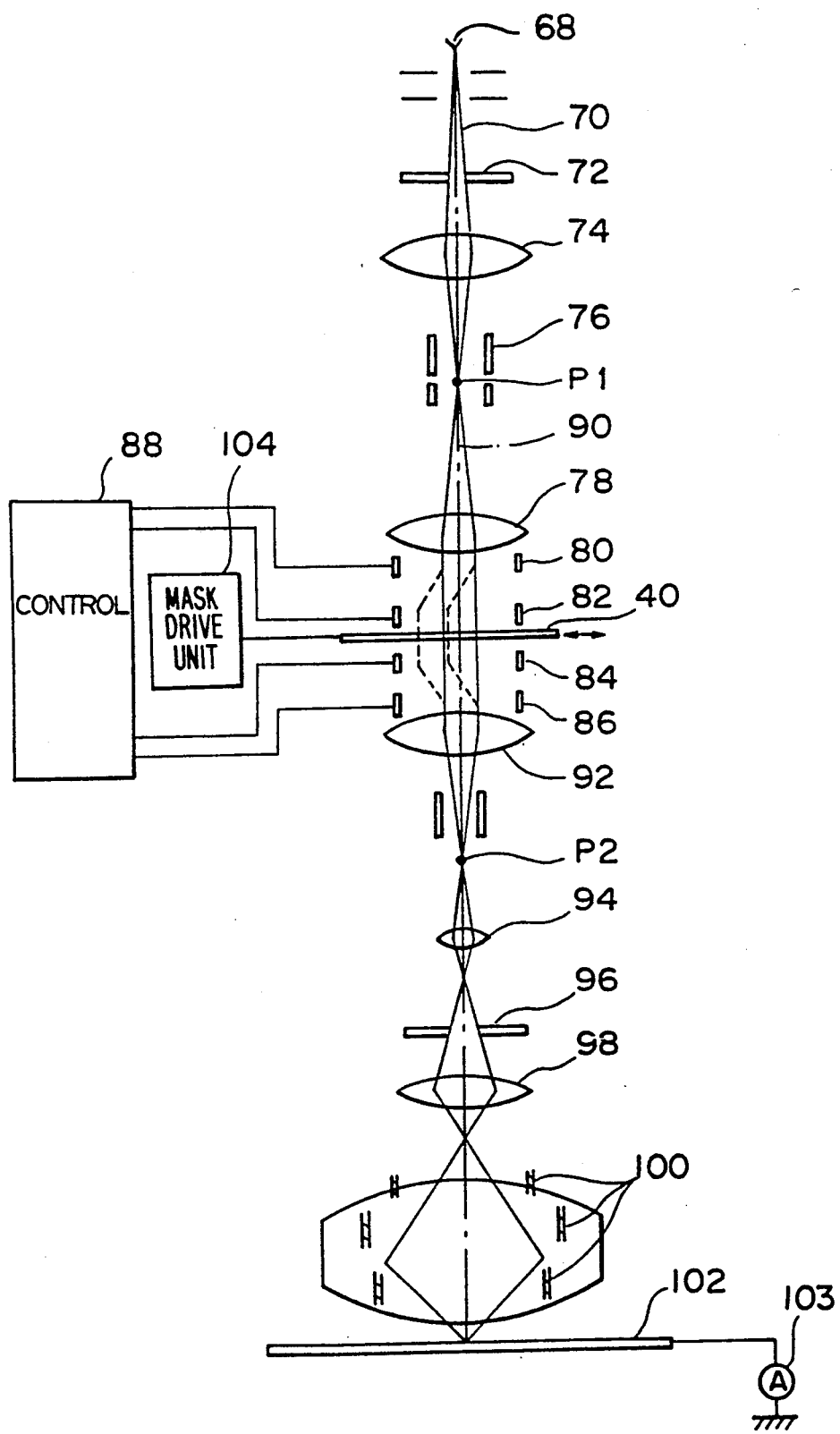
FIG. 2 is a diagram showing another conventional electron beam exposure system to which the present invention is applicable.

Referring to FIG. 2, the mask drive unit 104 is energized initially such that the mask 40 is moves to a position at which the optical axis 90 of the electron beam 70 is located generally at the center of the cutout 64. Next, the control unit 88 applies various control voltages to the deflectors 80–86 until the electron beam passes through the pinhole 96. More specifically, a predetermined control signal is applied to the deflector 80 and the control signals to the rest of the deflectors 82–86 are changed until the electron beam reaches the wafer 102 after passing through the pinhole 96. In order to detect the passage of the electron beam through the pinhole 96, a current detector 103 is used. The magnitude of the current that is detected by the detector 103 is on the order of several microamperes. As the pinhole 96 has a reduced size of 100 μm or less as described previously, a minute deviation of the electron beam from the optical axis is sufficient for causing the interruption of the electron beam and thereby preventing if from reaching the substrate 102. As a result of the calibration, the relative relationship between the respective magnitudes of the control signals to the deflectors 80–86 is established.

When the aforesaid relationship between the control signals to the deflectors 80–86 is thus established, the mask drive unit 104 moves the mask 40 again to a position at which the optical axis of the electron beam is located at the center of the second calibration part 46. Under that condition the control unit 88 the control signals while maintaining the aforesaid relationships, as established in the preceding step. During this process, the current is monitored by the detector 103. Thus, when the detector 103 detects the current, it means that the electron beam hits one of the apertures 66 in the second calibration part 46. As the apertures 66 are displaced by a common interval, one can calibrate the control signals as a function of the deflection of the electron beam. It should be noted that the object 102 is not necessarily a semiconductor wafer but any other object may be used during this calibration procedure. When the object is an insulating material, a thin conductive coating may be applied.

When the calibration of the deflectors 80–86 is thus completed, the writing of the pattern on the semiconductor wafer 102 is started. Thereby, the electron beam selectively hits one of the areas 56 of the pattern group 42 and the electron beam having the desired shaped cross section is formed upon passage therethrough. As already described, there are a number of pattern groups 42 on the mask 40, and the addressing of any selected aperture is made with precision as a result of the calibration achieved previously.

Figure 5:
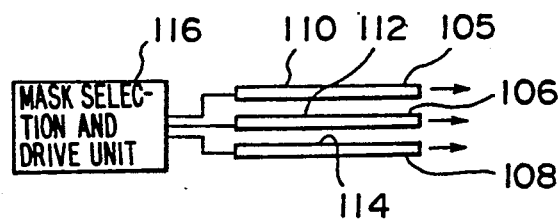
FIG. 5 is a schematic diagram showing a second embodiment of the present invention.

FIG. 5 shows a second embodiment of the present invention. Referring to FIG. 5, a mask selection unit 116 is provided instead of the mask drive unit 104, and the unit 116 selectively drives a plurality of masks 105–108. Here, the mask 105 carries thereon a number of basic patterns 110 corresponding to the pattern group 42, the mask 106 carries thereon a first calibration part 112 corresponding to the cutout 64, and the mask 108 carries thereon a second calibration part 114 corresponding to the apertures 66 of the part 46. In this embodiment, the mask 110 alone is used during the calibration for the mutual relationship of the control signals, the mask 112 alone is used during the calibration for the absolute magnitude of the control signals, and the mask 114 alone is used in the actual exposure of the semiconductor wafer.

Further, the present invention is not limited to the embodiments described heretofore, but various variations and modifications may be made without departing from the scope of the invention.

What is claimed is:

1. An electron exposure system for writing a pattern on an object by a focused electron beam, comprising:

electron source means for emitting electrons and directing same for travel along a predetermined optical axis as an electron beam;

mask means, positioned so as to intersect the optical axis and comprising an apertured plate carrying a plurality of apertures selectable in accordance with a desired one of corresponding patterns to be written on the object, for shaping the electron beam when the electron beam passed through a selected one of the apertures;

first deflection means, provided at a side of the mask means closer to the electron source means, for shifting the electron beam, as emitted from and directed by the electron source and directing means and traveling along the optical path, for deflecting the electron beam such that the electron beam travels along a path offset from the optical axis and such that the electron beam passes through a selected one of the apertures on the mask means in a direction substantially perpendicular tot he apertured plate of the mask means;

second defection means, provided at a side of the mask means away from the electron source means, for deflecting and thereby shifting the electron beam, as shifted previously by the first deflection means, such that the electron beam travels again in a path coincident with the optical axis;

said mask means further comprising a first calibration part having a size corresponding to an area within which the electron beam is shifted by the first deflection means, said first calibration part including a plurality of apertures, of predetermined size and disposed relatively to each other at a common displacement interval, for calibrating the deflection caused by the first and second deflection means;

mask driving means for selectively moving the mask means in a direction perpendicular to the optical axis;

focusing means for focusing the electron beam on the object; and third deflection means for deflecting the focused electron beam on the object.

2. An electron beam exposure system as claimed in claim 1, wherein said focusing means further comprises restriction means for providing a restricted passage through which the focused electron beam travels, the restriction means causing an interruption of the electron beam when the travel of the focused electron beam deviates from the optical axis, said electron beam exposure system further comprising current detection means for detecting a current flowing through the object.

3. An electron beam exposure system as claimed in claim 1 wherein said first calibration part is formed in the aperture plate and the apertures are arranged in a row and column formation at said common and predetermined, relative displacement intervals.

4. An electron beam exposure system as claimed in claim 3 wherein said apertures of the first calibration part are separated from each other by a common relative displacement interval of about 500 m.

5. An electron beam exposure system as claimed in claim 3 wherein said aperture plate of the mask means further comprises a second calibration part comprising a cutout formed in the aperture plate having a size corresponding to the area within which the electron beam is shifted by the first deflection means, such that the electron beam passes through the mask freely in correspondence tot he second calibration part.

6. An electron beam exposure system as claimed in claim 5 wherein said cutout of the second calibration part has a size of about 5 mm for each edge.

7. An electron beam exposure system as claimed in claim 1, wherein said mask means further comprises second and third aperture plates, said second aperture plate carrying the first calibration part and said third aperture plate carrying the second calibration part, said second calibration part comprising a cutout formed int he aperture plate such that the electron beam passes through the third aperture plate freely in correspondence to the second calibration part.

* * * * *

UNITED STATES PATENT AND TRADEMARK OFFICE
CERTIFICATE OF CORRECTION

Page 1 of 2

PATENT NO. : 5,105,089
DATED : April 14, 1992
INVENTOR(S) : Akio YAMADA

It is certified that error appears in the above-identified patent and that said Letters Patent is hereby corrected as shown below:

* Col. 1, line 34, before "electron" insert --the--;
*         line 35, before "electron" insert --the--.

Col. 2, line 21, delete "as";
        line 37, delete "back" (first occurrence);
        line 64, delete "that";
        line 67, delete "by".

Col. 3, line 58, after "again" insert --,--;
        line 64, after "sure" insert --system--.

Col. 4, line 7, change "i.e." to --, i.e.,--;
        line 44, after "mask" insert --,--;
        line 57, change "FIG. 23" to --FIG. 3--.

Col. 5, line 6, after "edge" insert --,--;
        line 30, change "moves" to --moved--;
        line 57, after "condition" insert --,--, and after "88" insert --increases the respective amplitudes of--.

Col. 6, line 7, after "desired" insert --,--;
        line 55, change "tot he" to --to the--.

UNITED STATES PATENT AND TRADEMARK OFFICE
CERTIFICATE OF CORRECTION

PATENT NO. : 5,105,089

DATED : April 14, 1992

INVENTOR(S) : Akio YAMADA

It is certified that error appears in the above-identified patent and that said Letters Patent is hereby corrected as shown below:

Col. 8, line 12, change "tot he" to --to the--;
line 21, change "int" to --in--;
line 22, change "he" to --the--.

Signed and Sealed this

Nineteenth Day of October, 1993

Attest:

BRUCE LEHMAN

*Attesting Officer*     *Commissioner of Patents and Trademarks*